(12) United States Patent
Kim (10) Patent No.: US 12,470,799 B2
(45) Date of Patent: Nov. 11, 2025

(54) ELECTRONIC DEVICE COMPRISING CAMERA MODULE WITH A MULTI-LAYER CERAMIC CONDENSER (MLCC) DISPOSED IN A HOLE IN A METAL PLATE UNDER A RIGID PRINTED CIRCUIT BOARD (RPCB)

(71) Applicant: Samsung Electronics Co., Ltd., Suwon-si (KR)

(72) Inventor: Sewon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 82 days.

(21) Appl. No.: 18/405,268

(22) Filed: Jan. 5, 2024

(65) Prior Publication Data

US 2024/0205530 A1   Jun. 20, 2024

Related U.S. Application Data

(63) Continuation of application No. PCT/KR2022/008445, filed on Jun. 15, 2022.

(30) Foreign Application Priority Data

Jul. 6, 2021   (KR) .................. 10-2021-0088474

(51) Int. Cl.
*H04N 5/335* (2011.01)
*H04N 23/57* (2023.01)
*H05K 1/18* (2006.01)

(52) U.S. Cl.
CPC ............. *H04N 23/57* (2023.01); *H05K 1/183* (2013.01); *H05K 2201/10015* (2013.01); *H05K 2201/10151* (2013.01); *H05K 2201/10636* (2013.01)

(58) Field of Classification Search
CPC ........................................ H05K 1/183
See application file for complete search history.

(56) References Cited

U.S. PATENT DOCUMENTS 9,029,759 B2   5/2015   Singh et al.
9,407,798 B2   8/2016   Havskjold et al.
(Continued)

FOREIGN PATENT DOCUMENTS

JP   2020035898 A   *  3/2020 ............. H01L 23/04
KR   20060022192 A      3/2006
(Continued)

OTHER PUBLICATIONS

International Search Report for PCT/KR2022/008445 mailed Sep. 21, 2022, 4 pages.
(Continued)

*Primary Examiner* — Gary C Vieaux
(74) *Attorney, Agent, or Firm* — Nixon & Vanderhye, P.C.

(57) ABSTRACT

A camera module according to an embodiment of the present disclosure may comprise: a rigid printed circuit board (RPCB), a metal plate coupled to the lower surface of the RPCB and having one or more holes formed therein, a multi-layer ceramic condenser (MLCC) disposed in the one or more holes in the RPCB, and an image sensor disposed on the metal plate. With reference to the lower surface of the RPCB, the MLCC may be formed to have a height less than the height of the metal plate. A camera module structure according to an embodiment of the present disclosure may comprise: a flexible printed circuit board (FPCB), an RPCB coupled to the lower surface of the FPCB and having one or more first holes formed therein, a metal plate coupled to the lower surface of the RPCB and having one or more second holes formed in areas corresponding to the first holes, respectively, an MLCC disposed in the first holes and the
(Continued)

second holes below the FPCB, and an image sensor disposed on the metal plate. The MLCC may be disposed in at least one of spaces formed through the first holes and the second holes. According to various embodiments of the present disclosure, a different camera module structure may be utilized such that no separate space is necessary to mount a laminated ceramic capacitor, and space utilization may be improved.

20 Claims, 6 Drawing Sheets

(56) References Cited

U.S. PATENT DOCUMENTS

| | | | |
|---|---|---|---|
| 11,418,687 | B2 | 8/2022 | Kim et al. |
| 2007/0217786 | A1 | 9/2007 | Cho et al. |
| 2011/0221956 | A1 | 9/2011 | Sekine et al. |
| 2013/0270419 | A1 | 10/2013 | Singh et al. |
| 2018/0352127 | A1 | 12/2018 | Wang et al. |
| 2021/0021744 | A1 | 1/2021 | Kim et al. |
| 2021/0281721 | A1 | 9/2021 | Momiuchi et al. |

FOREIGN PATENT DOCUMENTS

| | | |
|---|---|---|
| KR | 100769723 B1 | 10/2007 |
| KR | 100770690 B1 | 10/2007 |
| KR | 20110023448 A | 3/2011 |
| KR | 101619045 B1 | 5/2016 |
| KR | 10-2017-0112409 A | 10/2017 |
| KR | 20170112409 A | 10/2017 |
| KR | 20190055084 A | 5/2019 |
| KR | 10-2019-0110226 A | 9/2019 |
| KR | 20190110226 A | 9/2019 |
| KR | 20200063102 A | 6/2020 |
| KR | 102128781 B1 | 7/2020 |
| KR | 102148796 B1 | 8/2020 |
| KR | 20200112272 A | 10/2020 |
| WO | WO-2020057620 A1 * | 3/2020 ............ H01L 24/96 |

OTHER PUBLICATIONS

Written Opinion of the ISA for PCT/KR2022/008445 mailed Sep. 21, 2022, 5 pages.
Korean Office Action issued May 13, 2025 in corresponding Korean Patent Application No. 10-2021-0088474.
Korean Notice of Patent Grant issued Sep. 15, 2025 in corresponding Korean Patent Application No. 10-2021-0088474.

* cited by examiner

ELECTRONIC DEVICE COMPRISING CAMERA MODULE WITH A MULTI-LAYER CERAMIC CONDENSER (MLCC) DISPOSED IN A HOLE IN A METAL PLATE UNDER A RIGID PRINTED CIRCUIT BOARD (RPCB)

CROSS-REFERENCE TO RELATED APPLICATIONS

This application is a continuation of International Application No. PCT/KR2022/008445 designating the United States, filed on Jun. 15, 2022, in the Korean Intellectual Property Receiving Office and claiming priority to Korean Patent Application No. 10-2021-0088474, filed on Jul. 6, 2021, in the Korean Intellectual Property Office, the disclosures of each of which are incorporated by reference herein in their entireties.

BACKGROUND

Field

The disclosure relates to a structure which may reduce a size of a camera module.

Description of Related Art

In order to meet users' demand for convenience, ease of portability of electronic devices, developments in miniaturization and integration of electronic devices are continuously being conducted.

In particular, since inner spaces of electronic devices are limited, developments in miniaturization and integration of camara modules included in electronic devices are also being conducted. Typically, a camara module may have a layered structure in which components such as a lens assembly, a housing, an image sensor, a printed circuit board (PCB), a metal plate, a multi-layer ceramic condenser (MLCC) are layered in sequence.

According to related-art technologies, a separate space for mounting a MLCC is required, and hence, there is a problem that a size of a camera module increases as large as the space.

According to related-art technologies, due to the presence of a separate space for mounting a MLCC, there is a problem that space utilization in a camera module is degraded.

SUMMARY

In a camera module according to an example embodiment of the disclosure, the camera module may include: a rigid printed circuit board (RPCB); a metal plate coupled to a lower surface of the RPCB and having one or more holes formed therein; a multi-layer ceramic condenser (MLCC) disposed in the one or more holes under the RPCB; and an image sensor disposed on the metal plate, wherein a height of the MLCC may be less than a height of the metal plate with reference to a lower surface of the RPCB.

In a structure of a camera module, the structure may include: a flexible printed circuit board (FPCB), a rigid printed circuit board (RPCB) coupled to a lower surface of the FPCB and having one or more first holes formed therein, a metal plate coupled to a lower surface of the RPCB and having one or more second holes formed in areas corresponding to the first holes, respectively, a multi-layer ceramic condenser (MLCC) disposed in the first holes and the second holes under the FPCB, and an image sensor disposed on the metal plate, wherein the MLCC may be disposed in at least one space of spaces formed through the first holes and the second holes.

According to various example embodiments of the disclosure, a different structure of a camera module may be utilized, such that a separate space for mounting a MLCC may not be required and space utilization may be enhanced.

According to various example embodiments of the disclosure, a MLCC may be disposed in the proximity of an image sensor, such that signal characteristics of the image sensor may be maintained.

The effects achieved by the disclosure are not limited to those mentioned above, and other effects that are not mentioned above may be clearly understood to those skilled in the art based on the description provided below.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
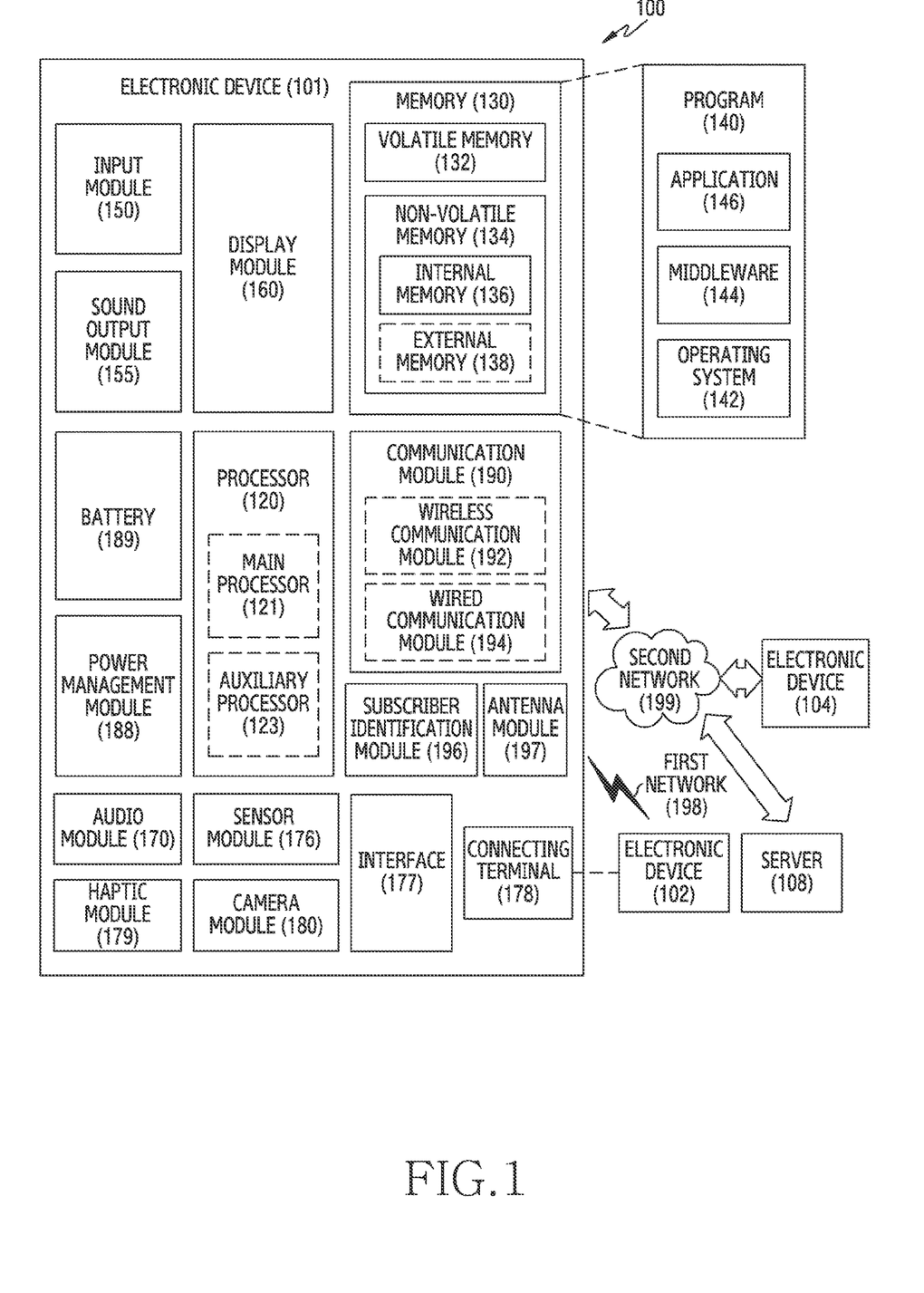
FIG. 1 is a block diagram illustrating an example electronic device in a network environment according to various embodiments.

FIG. 1 is a block diagram illustrating an example electronic device in a network environment according to various embodiments.

Referring to FIG. 1, an electronic device 101 in a network environment 100 may communicate with an electronic device 102 via a first network 198 (e.g., a short-range wireless communication network), or may communicate with an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, a memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. In a certain embodiment, at least one (e.g., the connection terminal 178) of the components may be omitted from the electronic device 101, or one or more other components may be added in the electronic device 101. In a certain embodiment, some of the components (for example, the sensor module 176, the camera module 180, or the antenna module 197) may be integrated into one component (for example, the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in a volatile memory 132, may process a command or data stored in the volatile memory 132, and may store resulting data in a non-volatile memory 134. According to an embodiment, the processor 120 may include a main processor 121 (e.g., a central processing device or an application processor), or an auxiliary processor 123 (e.g., a graphics processing device, a neural processing unit (NPU), an image signal processor, a sensor hub processor, or a communication processor) that is operable independently from, or in conjunction with, the main processor 121. For example, when the electronic device 101 includes the main processor 121 and the auxiliary processor 123, the auxiliary processor 123 may be set to consume lower power than the main processor 121, or to be specific to a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of other components (e.g., the camera module 180 or the communication module 190) functionally related thereto. According to an embodiment, the auxiliary processor 123 (e.g., a neural processing unit) may include a hardware structure that is specific to processing of an artificial intelligence (AI) model. The AI model may be created through machine learning. Such learning may be performed in the electronic device 101 itself, which performs the AI model, or may be performed through a separate server (for example, the server 108). A learning algorithm may include, for example, supervised learning, unsupervised learning, semi-supervised learning, or reinforcement learning, but is not limited to the above-described example. The AI model may include a plurality of AI neural network layers. The AI neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), a deep Q-network or one of combinations of two or more of the aforementioned neural networks, but is not limited to the above-described examples. The AI model may include a software structure additionally or alternatively, in addition to the hardware structure.

The memory 130 may store various data used by at least one component (e.g., the processor 120 or the sensor module 176) of the electronic device 101. The data may include, for example, software (e.g., the program 140) and input data or output data regarding a command related thereto. The memory 130 may include the volatile memory 132 or the non-volatile memory 134.

The program 140 may be stored in the memory 130 as software, and may include, for example, an operating system 142, middleware 144, or an application 146.

The input module 150 may receive a command or data to be used by a component (e.g., the processor 120) of the electronic device 101, from the outside (e.g., a user) of the electronic device 101. The input module 150 may include, for example, a microphone, a mouse, a keyboard, a key (for example, a button) or a digital pen (for example, a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used to receive an incoming call. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding device. According to an embodiment, the display module 160 may include a touch sensor set to detect a touch, or a pressure sensor set to measure the intensity of force generated by the touch.

The audio module 170 may convert a sound into an electrical signal or, reversely, may convert an electrical signal into a sound. According to an embodiment, the audio module 170 may obtain a sound via the input module 150, or may output a sound via the sound output module 155 or an external electronic device (e.g., the electronic device 102) (e.g., a speaker or a headphone) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support at least one specified protocol to be used for the electronic device 101 to be coupled with an external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

The connection terminal 178 may include a connector via which the electronic device 101 may be physically connected with an external electronic device (e.g., the electronic device 102). According to an embodiment, the connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be perceived by a user via tactile sensation or kinesthetic sensation of a user. According to an embodiment, the haptic module 179 may include, for example, a motor, a piezoelectric element, or an electric stimulator.

The camera module 180 may capture a still image or a moving image. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishment of a direct (e.g., wired) communication channel or a wireless communication channel between the electronic device 101 and an external electronic device (e.g., the electronic device 102, the electronic device 104, or the server 108), and performance of communication via the established communication channel. The communication module 190 may include at least one communication processor that is operable independently from the processor 120 (e.g., an application processor) and supports direct (e.g., wired) communication or wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication module). A corresponding communication module of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be integrated into a single component (e.g., a single chip), or may be implemented as a plurality of components (e.g., a plurality of chips) separate from one another. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network beyond a 4G network, and a next-generation communication technology, for example, a new radio (NR) access technology. The NR access technology may support high-speed transmission of high-capacity data (enhanced mobile broadband (eMBB)), terminal power minimization and access by multiple terminals (massive machine type communications (mMTC)), or high-reliability and low-latency (ultra-reliable and low latency communications (URLLC)). For example, the wireless communication module 192 may support a high frequency band (for example, mmWave band) to achieve a high data transmission rate. The wireless communication module 192 may support various technologies for guaranteeing performance in a high frequency band, for example, beamforming, massive multiple-input and multiple-output (MIMO), full dimensional MIMO (FD-MIMO), array antenna, analog beamforming, or large scale antenna. The wireless communication module 192 may support various requirements prescribed for the electronic device 101, an external electronic device (for example, the electronic device 104), or a network system (for example, the second network 199). According to an embodiment, the wireless communication module 192 may support a peak data rate (for example, 20 Gbps or more) for implementing eMBB, a loss coverage (for example, 164 dB or less) for implementing mMTC, or U-plane latency (for example, downlink (DL) and uplink (UL) of 0.5 ms or less, or round trip of 1 ms or less) for implementing URLLC.

The antenna module 197 may transmit or receive a signal or power to or from the outside (e.g., an external electronic device). According to an embodiment, the antenna module 197 may include an antenna including a radiator which is formed of a conductor or a conductive pattern formed on a substrate (for example, a PCB). According to an embodiment, the antenna module 197 may include a plurality of antennas (for example, an array antenna). In this case, at least one antenna appropriate for a communication scheme used in a communication network, such as the first network 198 or the second network 199, may be selected from the plurality of antennas by the communication module 190. A signal or power may be transmitted or received between the communication module 190 and an external electronic device via the selected at least one antenna. According to a certain embodiment, in addition to the radiator, other components (for example, a radio frequency integrated circuit (RFIC)) may be additionally formed as part of the antenna module 197.

According to various embodiments, the antenna module 197 may form an mmWave antenna module. According to an embodiment, the mmWave antenna module may include a printed circuit board, an RFIC which is disposed on a first surface (for example, a lower surface) of the printed circuit board or adjacent thereto, and supports a designated high frequency band (for example, mm Wave band), and a plurality of antennas (for example, an array antenna) which are disposed on a second surface (for example, an upper surface or a side surface) of the printed circuit board or adjacent thereto to transmit or receive a signal of the designated high frequency band.

At least some of the above-described components may be coupled to one another and may exchange signals (e.g., commands or data) with one another through an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled to the second network 199. The external electronic device 102 or 104 may be a device of a same type as, or a different type, from the electronic device 101. According to an embodiment, all or some of operations to be executed at the electronic device 101 may be executed in one or more external electronic devices of the external electronic devices 102, 104, or 108. For example, if the electronic device 101 should perform a function or a service automatically, or in response to a request from a user or another device, the electronic device 101, instead of or in addition to executing the function or the service, may request one or more external electronic devices to perform at least part of the function or the service. The one or more external electronic devices receiving the request may perform at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To achieve this, cloud computing, distributed computing, mobile edge computing (MEC), or client-server computing technology may be used, for example. The electronic device 101 may provide an ultra-low latency service using distributed computing or mobile edge computing, for example. In an embodiment, the external electronic device 104 may include an Internet of things (IOT) device. The server 108 may be an intelligent server that uses machine learning and/or a neural network. According to an embodiment, the external electronic device 104 or the server 108 may be included in the second network 199. The electronic device 101 may be applied to an intelligent service (for example, smart home, smart city, smart car, or health care) based on a 5G communication technology and an IoT-related technology.

Figure 2:
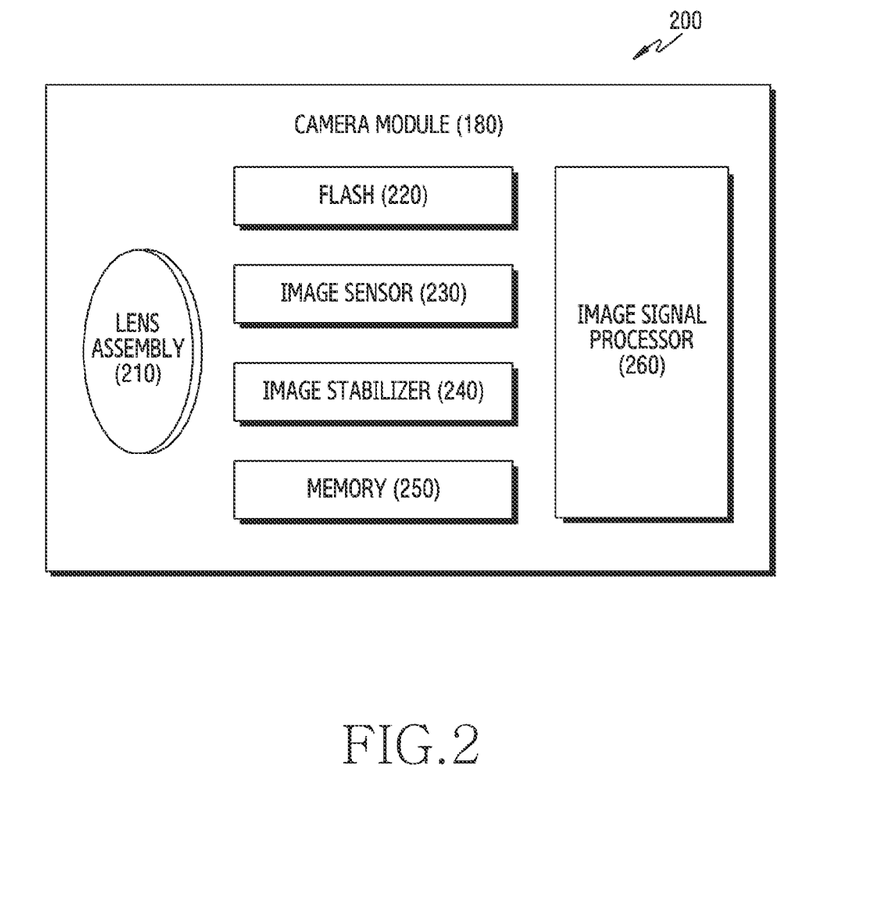
FIG. 2 is a block diagram illustrating an example configuration of a camera module according to various embodiments.

FIG. 2 is a block diagram 200 illustrating an example configuration of a camera module 180 according to various embodiments.

Referring to FIG. 2, a camera module 180 may include a lens assembly 210, a flash 220, an image sensor 230, an image stabilizer (e.g., including image stabilizing circuitry) 240, a memory 250 (for example, a buffer memory), and/or an image signal processor (e.g., including processing circuitry) 260. The lens assembly 210 may collect light emitted from a subject which is a target object for capturing an image. The lens assembly 210 may include one or more lenses. According to an embodiment, the camera module 180 may include a plurality of lens assemblies 210. In this case, the camera module 180 may include, for example, a dual camera, a 360-degree camera, or a spherical camera. Some of the plurality of lens assemblies 710 may have the same lens attribute (for example, a view angle, a focal distance, auto focusing, f number, or optical zoom), or at least one lens assembly may have one or more lens attributes different from lens attributes of other lens assemblies. The lens assembly 210 may include, for example, a wide angle lens or a telephoto lens.

The flash 220 may emit light which is used to strengthen light emitted or reflected from the subject. According to an embodiment, the flash 220 may include one or more light emitting diodes (LEDs) (for example, red-green-blue (RGB) LED, white LED, infrared LED, or ultraviolet LED), or a xenon lamp. The image sensor 230 may obtain an image corresponding to the subject, by converting light emitted or reflected from the subject and transmitted through the lens assembly 210 into an electrical signal. According to an embodiment, the image sensor 230 may include, for example, one image sensor selected from image sensors having different attributes, such as an RGB sensor, a black and white (BW) sensor, an IR sensor, or a UV sensor, a plurality of image sensors having the same attribute, or a plurality of image sensors having different attributes. The respective image sensors included in the image sensor 730 may be implemented using, for example, a charged coupled device (CCD) sensor or a complementary metal oxide semiconductor (CMOS) sensor.

The image stabilizer 240 may include various circuitry and shift at least one lens included in the lens assembly 210, or the image sensor 230 in a specific direction, or may control operating characteristics of the image sensor 230 (for example, adjusting a read-out timing), in response to a movement of the camera module 180 or the electronic device 101 including the same. This may compensate for at least part of a negative influence on a captured image by the movement. According to an embodiment, the image stabilizer 240 may detect such a movement of the camera module 180 or the electronic device 101 using a gyroscope sensor (not shown) or an acceleration sensor (not shown) disposed inside or outside the camera module 180. According to an embodiment, the image stabilizer 240 may be implemented by an optical image stabilizer, for example. The memory 250 may at least temporarily store at least part of an image obtained through the image sensor 230 for the next image processing operation. For example, when image acquisition is delayed due to a shutter or when a plurality of images are obtained at high speed, the obtained original image (for example, a Bayer-patterned image or an image of a high resolution) may be stored in the memory 250, and a copy image corresponding thereto (for example, an image of a low resolution) may be previewed through the display module 160. Thereafter, when a designated condition is satisfied (for example, a user input or a system command), at least part of the original image stored in the memory 250 may be obtained and processed by the image signal processor 260, for example. According to an embodiment, the memory 250 may be configured as at least part of the memory 130 or as a separate memory operated independently therefrom.

The image signal processor 260 may include various processing circuitry (as used herein, including the claims, the term "processor" may include various processing circuitry, including at least one processor, wherein one or more processors of at least one processor may be configured to perform the various functions described herein) and perform one or more image processing operations with respect to an image that is obtained through the image sensor 230 or an image that is stored in the memory 250. The one or more image processing operations may include, for example, depth map generation, 3-dimensional modeling, panorama generation, feature point extraction, image synthesis, or image compensation (for example, noise reduction, resolution adjustment, brightness adjustment, blurring, sharpening, or softening). Additionally or alternatively, the image signal processor 260 may perform control (for example, control of exposure time or control of a read-out timing) for at least one (for example, the image sensor 230) of the components included in the camera module 180. An image processed by the image signal processor 260 may be stored in the memory 250 again or may be provided to an external component (for example, the memory 130, the display module 160, the electronic device 102, the electronic device 104, or the server 108) of the camera module 180 to be additionally processed. According to an embodiment, the image signal processor 260 may be configured as at least part of the processor 120 or may be configured as a separate processor operated independently from the processor 120. When the image signal processor 260 is configured as a separate processor from the processor 120, at least one image processed by the image signal processor 260 may be displayed through the display module device 160 as it is by the processor 120 or after undergoing additional image processing.

According to an embodiment, the electronic device 101 may include a plurality of camera modules 180 having different attributes or functions. In this case, for example, at least one of the plurality of camera modules 180 may be a wide angle camera and at least one other camera module may be a telephoto lens camera. Similarly, at least one of the plurality of camera modules 180 may be a front-facing camera and at least one other camera module may be a rear-facing camera.

Figure 3:
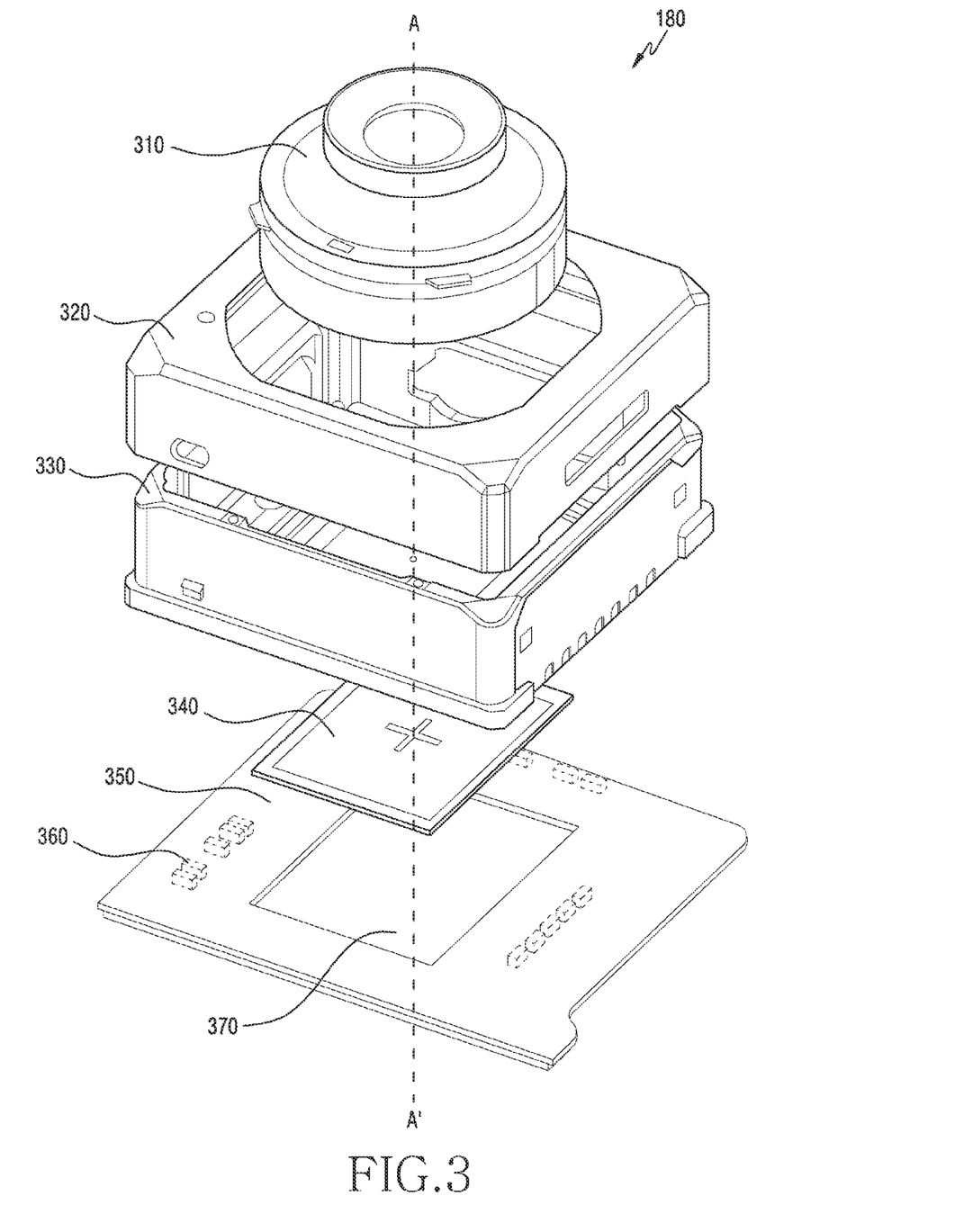
FIG. 3 is an exploded perspective view illustrating an example structure of a camera module according to various embodiments.

FIG. 3 is an exploded perspective view illustrating an example structure of a camera module according to various embodiments.

According to an embodiment, a camera module 180 may have a layered structure with reference to an optical axis A-A'.

According to an embodiment, the camera module 180 may include a lens assembly 310. The lens assembly 310 may correspond to the lens assembly 210 of FIG. 2.

According to an embodiment, a shield can 320 may form an upper exterior of the camera module 180. When viewed from the outside of the camera module 180, at least part of the lens assembly 310 may be seen through the shield can 210.

According to an embodiment, a housing 330 may be disposed on a lower portion of the shield can 320. The lens assembly 310 may be disposed inside the housing 330. The housing 330 may be disposed on a PCB 350.

According to an embodiment, an image sensor 340 may be disposed below the lens assembly 310. The image sensor 340 may be disposed on a lower portion of the housing 220. The image sensor 340 may be coupled onto a metal plate 370, and the PCB 350 may be adjacent to the image sensor 340 while surrounding the image sensor 340. The image sensor 340 may correspond to the image sensor 230 of FIG. 2.

According to an embodiment, the PCB 350 may include at least a rigid printed circuit board (RPCB), or may further include a flexible printed circuit board (FPCB). The PCB 350 may have a hole formed therein to correspond to a shape of the image sensor 340 to allow the image sensor 340 to be coupled onto the metal plate 370.

According to an embodiment, the metal plate 370 may be coupled to a lower surface of the PCB 350. One or more holes (or a plurality of holes) may be formed in the metal plate 370.

According to an embodiment, a multi-layer ceramic condenser (hereinafter, referred to as a 'MLCC') 360 may be disposed in the one or more holes (or a plurality of holes) formed in the metal plate 370.

According to an embodiment, the MLCC 360 may be coupled to a lower surface of the PCB 350.

Figure 4:
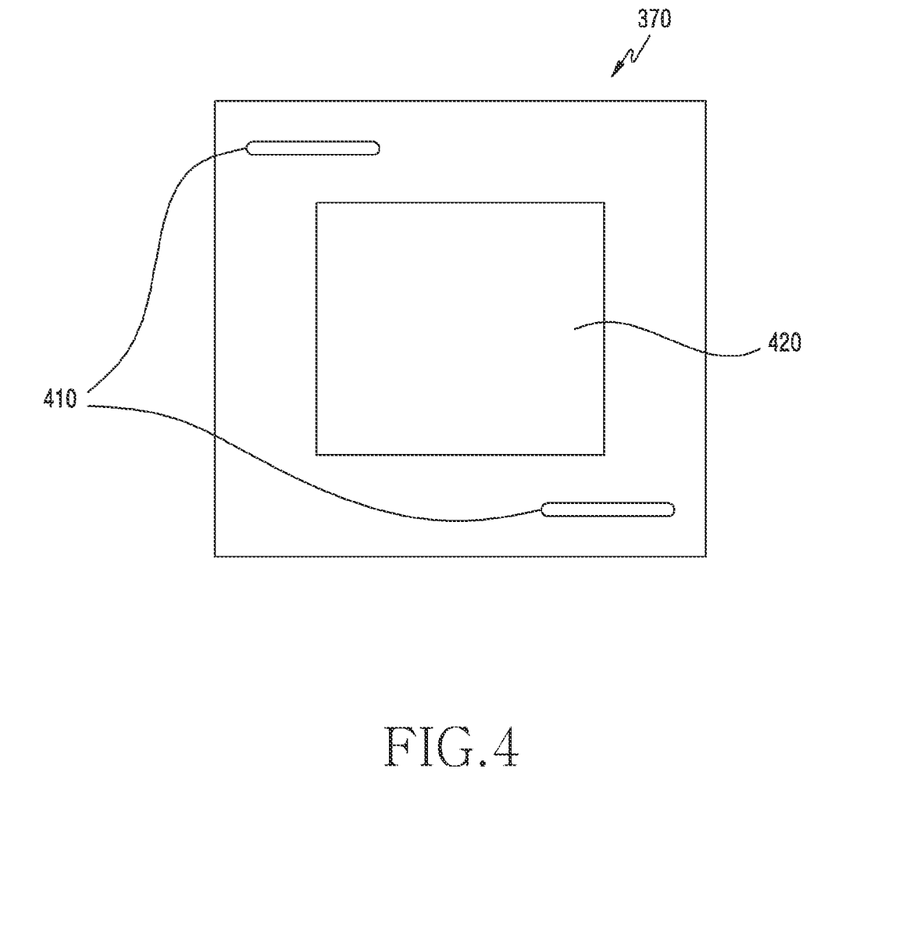
FIG. 4 is a diagram illustrating an example structure of a metal plate of a camera module according to various embodiments.

FIG. 4 illustrates a structure of a metal plate of a camera module according to an embodiment.

According to an embodiment, holes 410 may be formed in a metal plate 370 to mount a MLCC (for example, the MLCC 360 of FIG. 3). The holes 410 of the metal plate 370 may be formed by applying etching to the metal plate 370.

According to an embodiment, the holes 410 of the metal plate 370 may be around an etching area 420 on which an image sensor (for example, the image sensor 340) is disposed. The etching area 420 may be formed in a shape corresponding to a shape of an image sensor (for example, the image sensor 340).

According to an embodiment, the metal plate 370 may be coupled to a lower surface of a PCB 350.

According to an embodiment, the metal plate 370 is coupled to the lower surface of the PCB 350, such that spaces are formed due to the presence of the holes 410.

According to an embodiment, the holes 410 formed in the metal plate 370 are not limited to those illustrated in FIG. 4 and may have various shapes according to a design.

Figure 5:
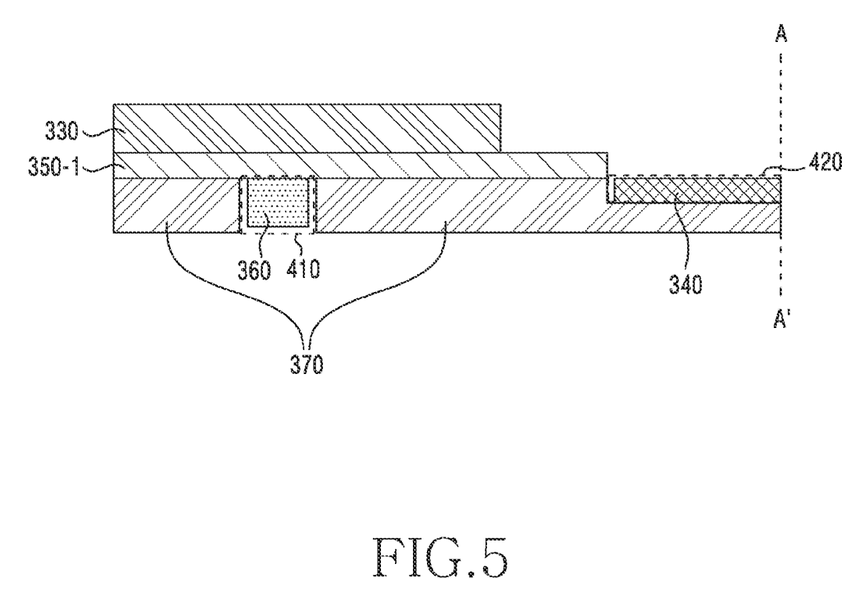
FIG. 5 is a cross-sectional view illustrating an arrangement structure of a MLCC included in a camera module according to various embodiments.

FIG. 5 is a cross-sectional view illustrating an arrangement structure of a MLCC included in a camera module according to various embodiments. FIG. 5 illustrates a part of the cross section of the layered structure of the camera module 180 of FIG. 3. A dashed line illustrated in FIG. 5 represents the optical axis A-A'.

In an embodiment, a RPCB 350-1 may be disposed under a housing 330.

In an embodiment, a metal plate 370 may be disposed under the RPCB 350-1. One or more holes (the term "hole" as used herein is not limited to a hole completely passing through the metal plate, and may include, for example, and without limitation, a recess formed in the metal plate) 410 may be formed in the metal plate 370 to have a MLCC 360 disposed therein. The one or more holes 410 may be formed by applying etching to the metal plate 370.

In an embodiment, an etching area 420 may be formed in the metal plate 370 to have an image sensor 340 disposed therein. The etching area 420 may have a shape and a size corresponding to a shape and a size of the image sensor 340. Etching is applied to the metal plate 370 such that the etching area 420 may be lower than other areas of the metal plate 370 by a predetermined height.

In an embodiment, the MLCC 360 may be coupled to a lower surface of the RPCB 350-1. The MLCC 360 may be disposed in the one or more holes 410 under the RPCB 350-1.

In an embodiment, a height of the MLCC 360 may be less than a height of the metal plate 370 with reference to the lower surface of the RPCB 350-1.

In an embodiment, a height of the MLCC 360 may be the same as a height of the metal plate 370 with reference to the lower surface of the RPCB 350-1.

In an embodiment, the one or more holes (or recesses) 410 may be formed around the etching area 420 (or the image sensor 340 disposed on the etching area 420). The one or more holes 410 may be formed in the proximity of the etching area 420 while surrounding the etching area 420 (or the image sensor 340 disposed on the etching area 420).

In an embodiment, the MLCC 360 may be disposed in the one or more holes 410 to be disposed in the proximity of the etching area 420 or the image sensor 340.

Figure 6:
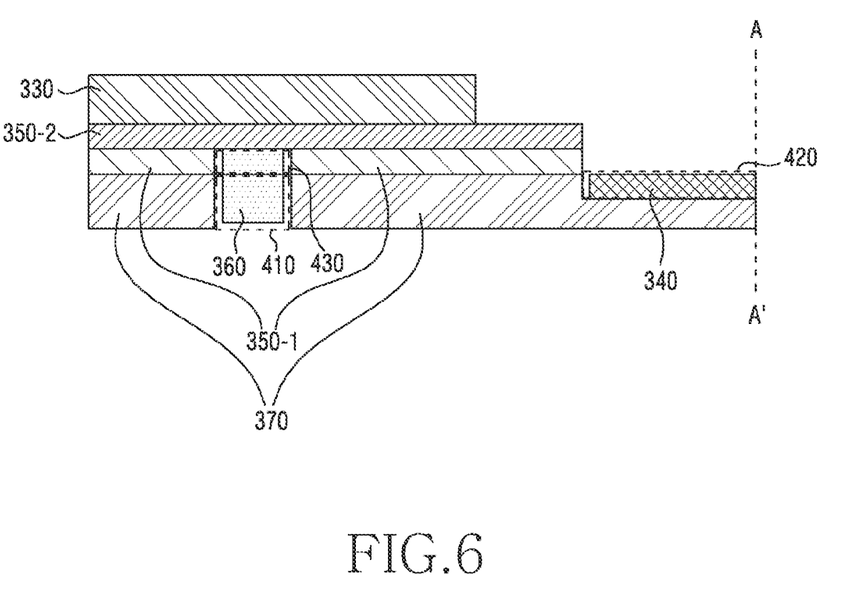
FIG. 6 is a cross-sectional view illustrating an arrangement structure of a MLCC included in a camera module according to various embodiments.

FIG. 6 is a cross-sectional view illustrating an example arrangement structure of a MLCC included in a camera module according to various embodiments. FIG. 6 illustrates a part of the cross section of the layered structure of the camera module 180 of FIG. 3. A dashed line illustrated in FIG. 6 represents the optical axis A-A'.

In an embodiment, an FPCB 350-2 may be disposed under a housing 330.

In an embodiment, a RPCB 350-1 may be disposed under the FPCB 350-2. One or more holes (or recesses) 430 may be formed in the RPCB 350-1 to have a MLCC 360 disposed therein.

In an embodiment, a metal plate 370 may be disposed under the RPCB 350-1. One or more holes (or recesses) 410 may be formed in the metal plate 370 to have the MLCC 360 disposed therein. The one or more holes 410 may be formed by applying etching to the metal plate 370. An etching area 420 may be formed in the metal plate 370 to have an image sensor 340 disposed thereon. The etching area 420 may have a shape and a size corresponding to a shape and a size of the image sensor 340. Etching is applied to the metal plate 370, such that the etching area 420 may be lower than other areas of the metal plate 370 by a predetermined height.

In an embodiment, the MLCC 360 may be coupled to a lower surface of the FPCB 350-2. The MLCC 360 may be disposed in the one or more holes 410 and the hole 430 under the FPCB 350-2.

In an embodiment, the one or more holes 410 and the holes 430 may form spaces to have the MLCC 360 disposed therein. The MLCC 360 may be disposed in at least one space of spaces formed by the holes 410 and the holes 430.

In an embodiment, the MLCC 360 may be disposed in a space that is formed by the holes 410, 430. For example, the MLCC 360 is disposed in the space formed by the holes 410, 430, such that at least part of the MLCC 360 does not protrude through a lower surface (for example, the opposite surface of an upper surface facing the RPCB 350-1) of the metal plate 370.

In an embodiment, a height of the MLCC 360 may be less than a sum of heights of the RPCB 350-1 and the metal plate 370 with reference to the lower surface of the FPCB 350-2. In an embodiment, a lower surface of the MLCC 360 (for example, the opposite surface of an upper surface facing the FPCB 350-2) may be positioned higher than the lower surface of the metal plate 370 (for example, the opposite surface of the upper surface facing the RPCB 350-1).

In an embodiment, a height of the MLCC 360 may be the same as a sum of heights of the RPCB 350-1 and the metal plate 370 with reference to the lower surface of the FPCB 350-2. In an embodiment, a lower surface of the MLCC 360 (for example, the opposite surface of the upper surface facing the FPCB 350-2) may be positioned at the same height as a lower surface of the metal plate 370 (for example, the opposite surface of the upper surface facing the RPCB 350-1).

In an embodiment, the one or more holes 410, 430 may be formed around the etching area 420 (or the image sensor 340 disposed on the etching area 420). The one or more holes 410, 430 may be formed in the proximity of the etching area 420 while surrounding the etching area 420 (or the image sensor 340 disposed on the etching area 420).

In an embodiment, the MLCC 360 may be disposed in the one or more holes 410, 430 to be disposed in the proximity of the etching area 420 or the image sensor 340.

In a camera module (for example, the camera module 180) according to an example embodiment, a camera module (for example, the camera module 180) may include: a rigid printed circuit board (RPCB) (for example, the RPCB 350-1); a metal plate (for example, the metal plate 370) coupled to a lower surface of the RPCB (for example, the RPCB 350-1) and having one or more holes formed therein; a multi-layer ceramic condenser (MLCC) (for example, the MLCC 360) disposed in the one or more holes under the RPCB (for example, the RPCB 350-1); and an image sensor (for example, the image sensor 340) disposed on the metal plate (for example, the metal plate 370), wherein a height of the MLCC (for example, the MLCC 360) may be less than a height of the metal plate (for example, the metal plate 370) with reference to a lower surface of the RPCB (for example, the RPCB 350-1).

In the camera module (for example, the camera module 180) according to an example embodiment, the one or more holes may be formed by applying etching to the metal plate (for example, the metal plate 370).

In the camera module (for example, the camera module 180) according to an example embodiment, the MLCC (for example, the MLCC 360) may be coupled to a lower surface of the RPCB (for example, the RPCB 350-1).

In the camera module (for example, the camera module 180) according to an example embodiment, the image sensor (for example, the image sensor 340) may be disposed on an etching area (for example, the etching area 420) formed by applying etching to the metal plate (for example, the metal plate 370).

In the camera module (for example, the camera module 180) according to an example embodiment, the one or more holes may be formed around the etching area (for example, the etching area 420).

In the camera module (for example, the camera module 180) according to an example embodiment, the etching area (for example, the etching area 420) may have a shape and a size corresponding to a shape and a size of the image sensor (for example, the image sensor 340).

In the camera module (for example, the camera module 180) according to an example embodiment, the camera module (for example, the camera module 180) may further include a housing (for example, the housing 330), wherein the RPCB (for example, the RPCB 350-1) may be disposed under the housing (for example, the housing 330).

In a structure of a camera module (for example, the camera module 180) according to an example embodiment, the structure of the camera module (for example, the camera module 180) may include: a flexible printed circuit board (FPCB) (for example, the FPCB 350-2), a rigid printed circuit board (RPCB) (for example, the RPCB 350-1) coupled to a lower surface of the FPCB (for example, the FPCB 350-2) and having one or more first holes formed therein, a metal plate (for example, the metal plate 370) coupled to a lower surface of the RPCB (for example, the RPCB 350-1) and having one or more second holes formed in areas corresponding to the first holes, respectively, a multi-layer ceramic condenser (MLCC) (for example, the MLCC 360) disposed in the first holes and the second holes under the FPCB (for example, the FPCB 350-2), and an image sensor (for example, the image sensor 340) disposed on the metal plate (for example, the metal plate 370), wherein the MLCC (for example, the MLCC 360) may be disposed in at least one space of spaces formed through the first holes and the second holes.

In the structure of the camera module (for example, the camera module 180) according to an example embodiment, the second holes are formed by applying etching to the metal plate (for example, the metal plate 370).

In the structure of the camera module (for example, the camera module 180) according to an example embodiment, the MLCC (for example, the MLCC 360) may be coupled to a lower surface of the FPCB (for example, the FPCB 350-2).

In the structure of the camera module (for example, the camera module 180) according to an example embodiment, the image sensor (for example, the image sensor 340) may be disposed on an etching area (for example, the etching area 420) formed by applying etching to the metal plate (for example, the metal plate 370).

In the structure of the camera module (for example, the camera module 180) according to an example embodiment, the first holes and the second holes may be formed around the etching area (for example, the etching area 420).

In the structure of the camera module (for example, the camera module 180) according to an example embodiment, the etching area (for example, the etching area 420) may have a shape and a size corresponding to a shape and a size of the image sensor (for example, the image sensor 240).

In the structure of the camera module (for example, the camera module 180) according to an example embodiment, the structure of the camera module (for example, the camera module 180) may further include a housing (for example, the housing 330, and the FPCB (for example, the FPCB 350-2) may be disposed under the housing (for example, the housing 330).

In the structure of the camera module (for example, the camera module 180) according to an example embodiment, a height of the MLCC (for example, the MLCC 360) may be less than a height of the metal plate (for example, the metal plate 370) with reference to a lower surface of the FPCB (for example, the FPCB 350-2).

In an electronic device (for example, the electronic device 101) according to an example embodiment, the electronic device (for example, the electronic device 101) may include: a camera module including a camera (for example, the camera module 180), and at least one processor electrically connected with the camera module (for example, the camera module 180), the camera module (for example, the camera module 180) may include: a rigid printed circuit board (RPCB) (for example, the RPCB 350-1); a metal plate (for example, the metal plate 370) coupled to a lower surface of the RPCB (for example, the RPCB 350-1) and having one or more holes formed therein; a multi-layer ceramic condenser (MLCC) (for example, the MLCC 360) disposed in the one or more holes under the RPCB (for example, the RPCB 350-1); and an image sensor (for example, the image sensor 340) disposed on the metal plate (for example, the metal plate 370), a height of the MLCC (for example, the MLCC 360) may be less than a height of the metal plate (for example, the metal plate 370) with reference to a lower surface of the RPCB (for example, the RPCB 350-1), and one or more of the at least one processor may be configured to obtain an image using the image sensor (for example, the image sensor 340).

In the electronic device (for example, the electronic device 101) according to an example embodiment, the one or more holes may be formed by applying etching to the metal plate (for example, the metal plate 370).

In the electronic device (for example, the electronic device 101) according to an example embodiment, the MLCC (for example, the MLCC 360) may be coupled to a lower surface of the RPCB (for example, the RPCB 350-1).

In the electronic device (for example, the electronic device 101) according to an example embodiment, the image sensor (for example, the image sensor 340) may be disposed on an etching area (for example, the etching area 420) that is formed by applying etching to the metal plate (for example, the metal plate 370).

In the electronic device (for example, the electronic device 101) according to an example embodiment, the one or more holes may be formed around the etching area (for example, the etching area 420).

The electronic device according to various embodiments of the disclosure may be various types of devices. The electronic device may include, for example, a portable communication device (for example, a smart phone), a computer device, a portable multimedia device, a portable medical device, a camera, a wearable device, a home appliance, or the like. According to an embodiment of the disclosure, the electronic device is not limited to the above-described devices.

It should be appreciated that various embodiments of the disclosure and the terms used therein are not intended to limit the technological features set forth herein to particular embodiments, and include various changes, equivalents, or alternatives for a corresponding embodiment. With regard to the description of the drawings, similar reference numerals may be used to refer to similar or related elements. It is to be understood that a singular form of a noun corresponding to an item may include one or more of the items, unless the relevant context clearly indicates otherwise. As used herein, each of such phrases as "A or B," "at least one of A and B," "at least one of A or B," "A, B, or C," "at least one of A, B, and C," and "at least one of A, B, or C," may include one or all possible combinations of the items enumerated together in a corresponding one of the phrases. As used herein, such terms as "1st" and "2nd," or "first" and "second" may be used to simply distinguish a corresponding component from another, and does not limit the components in other aspect (for example, importance or order). It is to be understood that if an element (for example, a first element) is referred to, with or without the term "operatively" or "communicatively", as "coupled with," "coupled to", "connected with", or "connected to" another element (for example, a second element), the element may be coupled with another element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments of the disclosure may be implemented as software (for example, the program 140) including one or more instructions that are stored in a storage medium (for example, internal memory 136 or external memory 138) that is readable by a machine (for example, the electronic device 101). For example, a processor (for example, the processor 120) of the machine (for example, the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (for example, an electromagnetic wave), but this term does not differentiate between a case where data is semi-permanently stored in the storage medium and a case where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (for example, compact disc read only memory (CD-ROM)), or may be distributed (for example, downloaded or uploaded) online via an application store (for example, Play Store™), or between two user devices (for example, smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (for example, a module or a program) of the above-described components may include a single entity or multiple entities, and some of the multiple entities may be separately disposed in other components. According to various embodiments, one or more of the above-described components or operations may be omitted, or one or more other components or operations may be added. Alternatively or additionally, a plurality of components (for example, modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A camera module comprising:
a rigid printed circuit board (RPCB);
a metal plate coupled to a lower surface of the RPCB and having one or more holes formed therein;
a multi-layer ceramic condenser (MLCC) disposed in the one or more holes under the RPCB; and
an image sensor disposed on the metal plate,
wherein a height of the MLCC is less than a height of the metal plate with reference to a lower surface of the RPCB.

2. The camera module of claim 1, wherein the one or more holes are formed by applying etching to the metal plate.

3. The camera module of claim 1, wherein the MLCC is coupled to a lower surface of the RPCB.

4. The camera module of claim 1, wherein the image sensor is disposed on an etching area formed by applying etching to the metal plate.

5. The camera module of claim 4, wherein the one or more holes are formed around the etching area.

6. The camera module of claim 1, wherein the etching area has a shape and a size corresponding to a shape and a size of the image sensor.

7. The camera module of claim 1, further comprising a housing,
wherein the RPCB is disposed under the housing.

8. The camera module of claim 1, wherein the RPCB is coupled to a lower surface of a flexible printed circuit board (FPCB) and comprises one or more first holes,
wherein the metal plate is coupled to a lower surface of the RPCB and comprises one or more second holes formed in areas corresponding to the first holes, respectively,
wherein the MLCC is disposed in the first holes and the second holes under the FPCB,
wherein the image sensor is disposed on the metal plate, and
wherein the MLCC is disposed in at least one space of spaces formed through the first holes and the second holes.

9. The camera module of claim 8, wherein the second holes are formed by applying etching to the metal plate.

10. The camera module of claim 8, wherein the MLCC is coupled to a lower surface of the FPCB.

11. The camera module of claim 8, wherein the image sensor is disposed on an etching area formed by applying etching to the metal plate.

12. The camera module of claim 8, wherein the first holes and the second holes are formed around the etching area.

13. The camera module of claim 12, wherein the etching area has a shape and a size corresponding to a shape and a size of the image sensor.

14. The camera module of claim 8, further comprising a housing,
wherein the FPCB is disposed under the housing.

15. The camera module of claim 8, wherein a height of the MLCC is less than a height of the metal plate with reference to a lower surface of the FPCB.

16. An electronic device comprising:
a camera module; and
at least one processor electrically connected with the camera module;
the camera module comprising:
a rigid printed circuit board (RPCB);
a metal plate coupled to a lower surface of the RPCB and having one or more holes formed therein;
a multi-layer ceramic condenser (MLCC) disposed in the one or more holes under the RPCB; and
an image sensor disposed on the metal plate,
wherein a height of the MLCC is less than a height of the metal plate with reference to a lower surface of the RPCB, and
wherein one or more of the at least one processor is configured to obtain image through the image sensor.

17. The electronic device of claim 16, wherein the one or more holes are formed by applying etching to the metal plate.

18. The electronic device of claim 16, wherein the MLCC is coupled to a lower surface of the RPCB.

19. The electronic device of claim 16, wherein the image sensor is disposed on an etching area formed by applying etching to the metal plate.

20. The electronic device of claim 19, wherein the one or more holes are formed around the etching area.

* * * * *